(12) United States Patent
Omote et al.

(10) Patent No.: US 6,979,644 B2
(45) Date of Patent: Dec. 27, 2005

(54) METHOD OF MANUFACTURING ELECTRONIC CIRCUIT COMPONENT

(75) Inventors: Koji Omote, Kawasaki (JP); Masataka Mizukoshi, Kawasaki (JP); Osamu Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 175 days.

(21) Appl. No.: 10/420,751

(22) Filed: Apr. 23, 2003

(65) Prior Publication Data

US 2003/0200654 A1    Oct. 30, 2003

(30) Foreign Application Priority Data

Apr. 25, 2002 (JP) ............... 2002-124691

(51) Int. Cl.$^7$ ............................................. H01L 21/44
(52) U.S. Cl. ................................. 438/667; 438/620
(58) Field of Search ................... 438/620, 667

(56) References Cited

U.S. PATENT DOCUMENTS

| | | | |
|---|---|---|---|
| 4,521,280 A * | 6/1985 | Bahrle et al. ............... 29/829 |
| 5,707,893 A * | 1/1998 | Bhatt et al. ................. 216/18 |
| 6,184,060 B1 * | 2/2001 | Siniaguine ................ 438/106 |
| 6,221,694 B1 * | 4/2001 | Bhatt et al. ................ 438/122 |
| 6,392,296 B1 * | 5/2002 | Ahn et al. .................. 257/698 |
| 6,441,479 B1 * | 8/2002 | Ahn et al. .................. 257/700 |
| 6,498,381 B2 * | 12/2002 | Halahan et al. ............. 257/449 |
| 6,617,681 B1 * | 9/2003 | Bohr ........................ 257/700 |
| 6,678,952 B2 * | 1/2004 | Jamil ........................ 29/847 |
| 6,716,572 B2 * | 4/2004 | Yamamoto et al. ......... 430/318 |
| 6,844,241 B2 * | 1/2005 | Halahan et al. ............. 438/454 |
| 6,897,148 B2 * | 5/2005 | Halahan et al. ............. 438/678 |

FOREIGN PATENT DOCUMENTS

JP       10-013038        1/1998

* cited by examiner

Primary Examiner—Matthew Smith
Assistant Examiner—Lex H. Malsawma
(74) Attorney, Agent, or Firm—Armstrong, Kratz, Quintos, Hanson & Brooks, LLP (57) ABSTRACT

A method of manufacturing an electronic circuit component, including the steps of: (a) forming a first thin film circuit element on a surface of a circuit board made of an Si substrate; (b) forming a hole or trench from the surface of the circuit board through at least a portion of a thickness of the Si substrate by etching; (c) forming an insulating film covering a surface of the formed hole or trench; (d) adhering a dry film of photoresist to the surface of the circuit board, the dry film capping an opening of the hole or trench; (e) patterning the dry film; and (f) by using the patterned dry film as a mask, etching the insulating film. An electronic circuit component having through conductors and being less influenced by high temperature annealing can be manufactured.

10 Claims, 13 Drawing Sheets

METHOD OF MANUFACTURING ELECTRONIC CIRCUIT COMPONENT

CROSS REFERENCE TO RELATED APPLICATION

This application is based on Japanese Patent Application No. 2002-124691, filed on Apr. 25, 2002, the entire contents of which are incorporated herein by reference.

BACKGROUND OF THE INVENTION

A) Field of the Invention

The present invention relates to a method of manufacturing an electronic circuit component and, more particularly, to a method of manufacturing an electronic circuit component having a conductor pattern buried in holes or trenches.

An example of such an electronic circuit component is an interposer substrate. For example, when LSIs are mounted on a mother board of a computer, an interposer substrate is interposed between LSIs and the mother board in some cases. If an interposer substrate is formed by an Si substrate, the interposer substrate can be manufactured by utilizing manufacturing techniques of semiconductor devices. When through conductors are formed through layers of IC, LSI, memory or the like, a multilevel circuit can be manufactured.

B) Description of the Related Art

A multi-chip module (MCM) board used with a main frame computer and the like has a plurality of LSls mounted thereon. Capacitors are often mounted on the MCM board in order to eliminate noises from the power supply voltages. Conventionally, a ceramic capacitor chip is mounted on an MCM board.

Recent computers have a high clock frequency. If a ceramic capacitor chip is to be mounted, it becomes necessary to use lead wires. These lead wires have impedance components such as inductance L so that high speed performance is degraded.

In order to improve high speed performance, an interposer substrate mounted with capacitors just under LSIs to be mounted is desired in order to shorten the wiring length. In order to reduce the opposing areas of capacitor electrodes and obtain a large capacitance, it is preferable to use dielectric material having a high dielectric constant as the material of the capacitor dielectric film.

For example, barium strontium titanate (BST, $(Ba, Sr)TiO_3$) is used as the material of the capacitor dielectric film. In order to improve the capacitor characteristics, after the capacitor dielectric film is formed, BST is preferably annealed at about 700° C. in an oxidizing atmosphere such as air. The circuit board is required to be excellent in heat resistance in order to perform high temperature annealing in an oxidizing atmosphere.

Although a ceramic substrate is excellent in heat resistance, it has the problem of scratches on a polished surface and poor smoothness of a substrate surface. When ceramic is baked, it shrinks and the volume is reduced. It is therefore difficult to precisely control a pitch between electrodes or pads.

An interposer substrate made of an Si substrate can utilize the manufacturing techniques of Si integrated circuit devices so that a high precision can be realized. A method of manufacturing a circuit board made of an Si substrate has not established as of yet.

SUMMARY OF THE INVENTION

An object of this invention is to provide a method of manufacturing an electronic circuit component capable of manufacturing a high precision circuit board.

Another object of the invention is to provide a method of manufacturing an electronic circuit component not influenced by high temperature annealing.

According to one aspect of the present invention, there is provided a method of manufacturing an electronic circuit component, comprising the steps of: (a) forming a first thin film circuit element on a surface of a circuit board made of an Si substrate; (b) forming a hole or trench from the surface of the circuit board through at least a portion of a thickness of the Si substrate by etching; (c) forming an insulating film covering a surface of the formed hole or trench; (d) adhering a dry film of photoresist to the surface of the circuit board, the dry film capping an opening of the hole or trench; (e) patterning the dry film; and (f) by using the patterned dry film as a mask, etching the insulating film.

According to another aspect of the present invention, there is provided a method of manufacturing an electronic circuit component, comprising the steps of: (a) preparing a circuit board having a hole or trench extending from a surface of the circuit board to an inside of the circuit board; (b) adhering a dry film of photoresist to a surface of the circuit board, the dry film capping an opening of the hole or trench; (c) patterning the dry film; and (d) by using the patterned dry film as a mask, processing the circuit board.

As above, a novel manufacture method for an electronic circuit component is provided.

After thin film circuit elements are formed, through conductors are formed. Restrictions of a thermal process for forming thin film circuit elements can be relaxed.

DESCRIPTION OF THE PREFERRED EMBODIMENTS

Description will be made on the preferred embodiments of the invention, referring to the drawings. The embodiments have no limitative meaning.

Figure 1A:
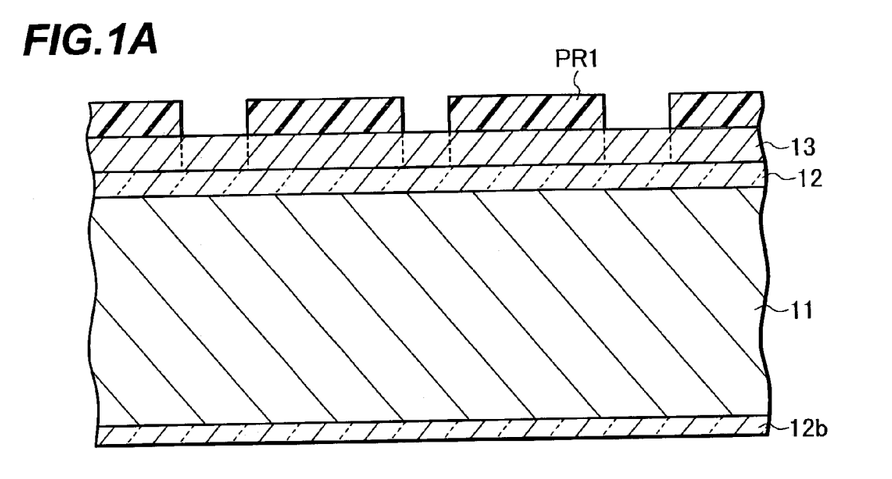
FIGS. 1A to 1O are schematic cross sectional views illustrating a method of manufacturing an electronic circuit component according to an embodiment of the invention.

As shown in FIG. 1A, the top and bottom surfaces of an Si substrate 11 having a thickness of, e.g., about 600 μm are thermally oxidized to form silicon oxide films 12 and 12b having a thickness of about 1 μm. Although the silicon oxide film 12b on the bottom surface is not necessarily required, it is formed at the same time when the silicon oxide film 12 on the top surface is formed.

On the silicon oxide film 12 on the top surface, a Pt film 13 having a thickness of, e.g., about 100 nm is deposited by sputtering or the like. Instead of the Pt film, a noble metal film which cannot be oxidized or does not lose conductivity even if it is oxidized, a conductive oxidized noble film or the like may be formed. Conductive films of different kinds may be laminated. An insulating film may be laminated as an adhesion layer between the silicon oxide film 12 and Pt film 13.

A photoresist layer is coated on the Pt film 13, exposed and developed to form a photoresist pattern PR1. By using the photoresist pattern PR1 as a mask, the exposed Pt film 13 is etched or milled to pattern the Pt film 13. The photoresist pattern PR1 is thereafter removed with a resist remover.

Figure 1B:
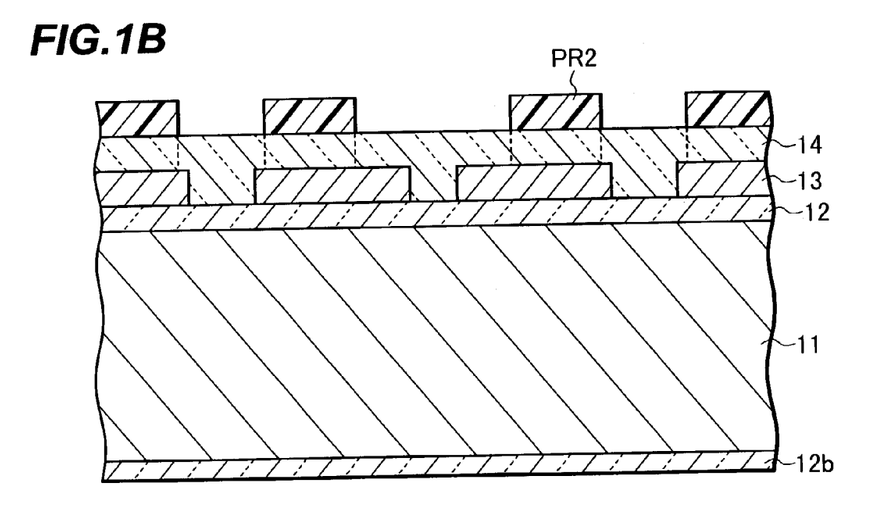

As shown in FIG. 1B, a barium strontium titanate (BST) film 14 having a thickness of, e.g., about 100 nm is formed covering the Pt layer 13. The BST layer can be formed by a zol-gel process or the like. Other dielectric films having a high dielectric constant may be used. A photoresist pattern PR2 is formed on the BST film 14. By using the photoresist pattern PR2 as a mask, the BST film 14 is etched. The photoresist pattern PR2 is thereafter removed.

Figure 1C:
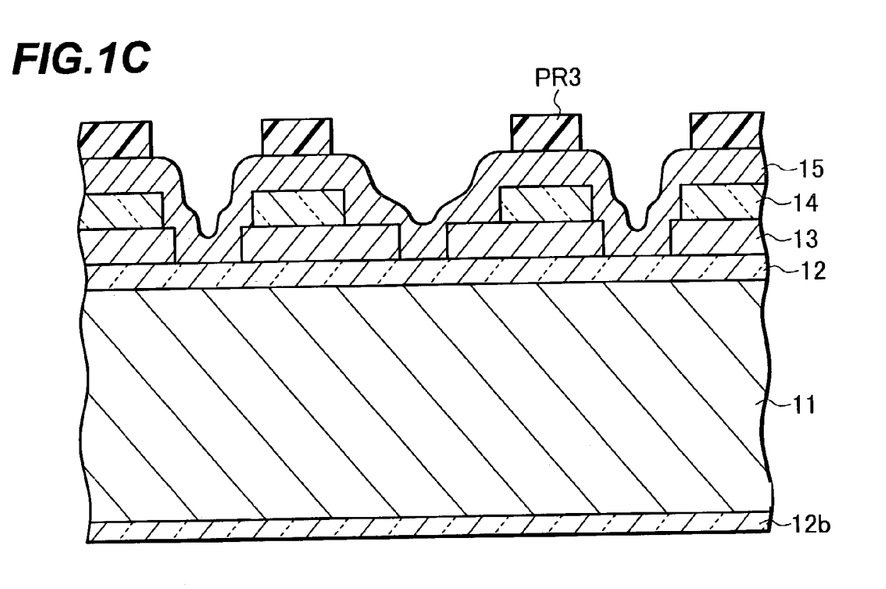

As shown in FIG. 1C, a Pt layer 15 having a thickness of, e.g., about 100 nm is formed over the substrate by sputtering. A photoresist pattern PR3 is formed on the Pt layer 15. By using the photoresist pattern PR3 as a mask, the Pt layer 15 is etched or milled. The photoresist pattern PR3 is thereafter removed.

Figure 1D:
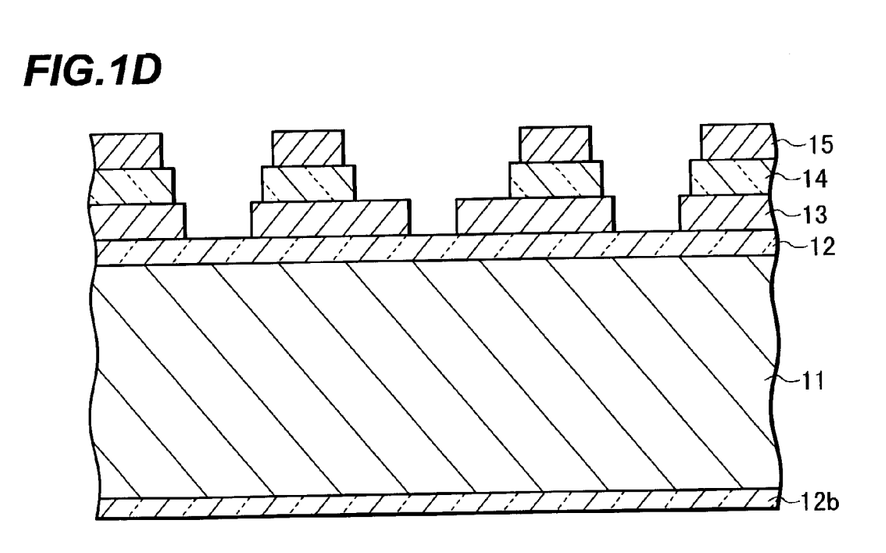

FIG. 1D shows the structure of a capacitor formed by the above-described processes. Although a plurality of capacitor structures are shown in FIG. 1D, these capacitor structures are contiguous to each other in the area not shown. The areas where the capacitor structures are not formed constitute openings through which through conductors are passed.

Figure 1E:
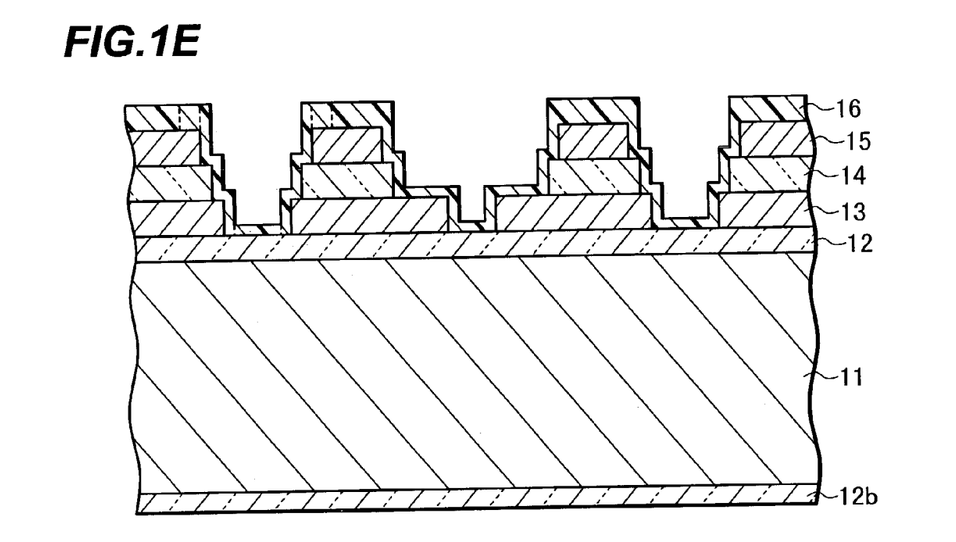

As shown in FIG. 1E, covering the capacitor structures, a photosensitive polyimide layer 16 is coated to a thickness of, e.g., about 500 nm. The photosensitive polyimide layer 16 is exposed and developed to partially and selectively remove it.

Figure 1F:
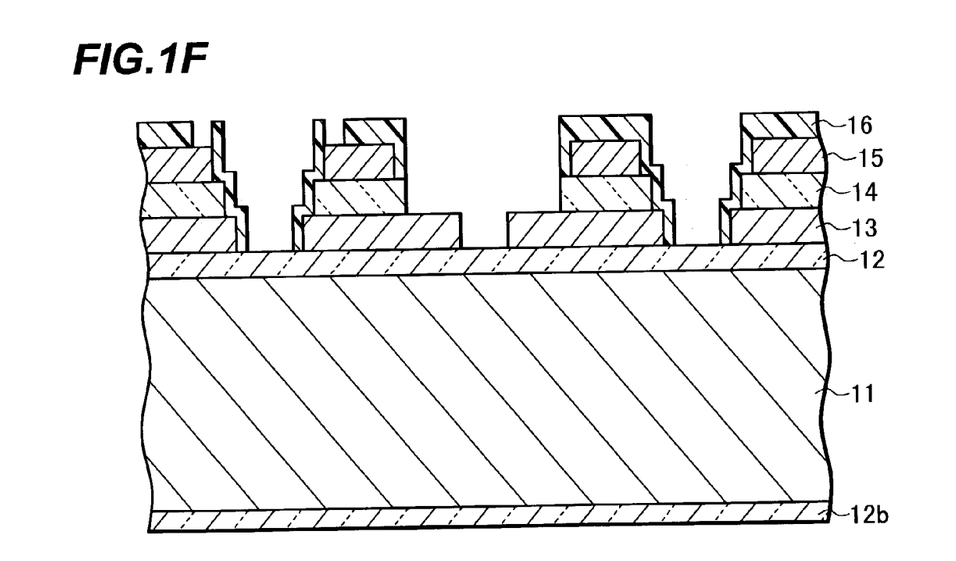

As shown in FIG. 1F, the insulating film of polyimide is therefore formed which has openings exposing the upper electrode 15 and lower electrode 13 of the capacitor and covers the other surface of the capacitor.

Figure 1G:
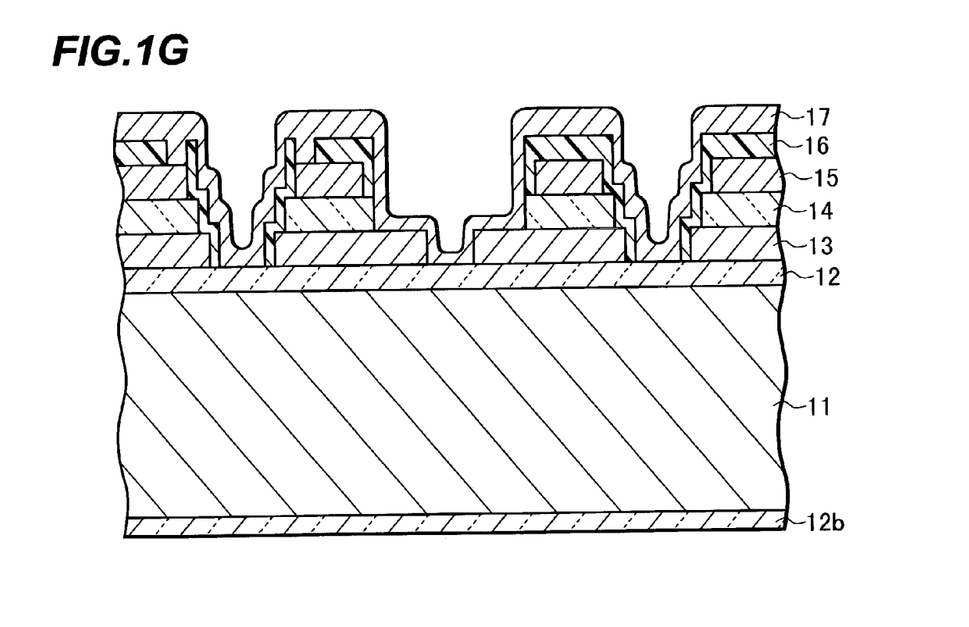

As shown in FIG. 1G, a copper wiring layer 17 is formed covering the polyimide layer 16. For example, the copper wiring layer is formed by depositing a Cr adhesion layer and a Cu seed layer by sputtering and plating a Cu layer thereon.

Figure 1H:
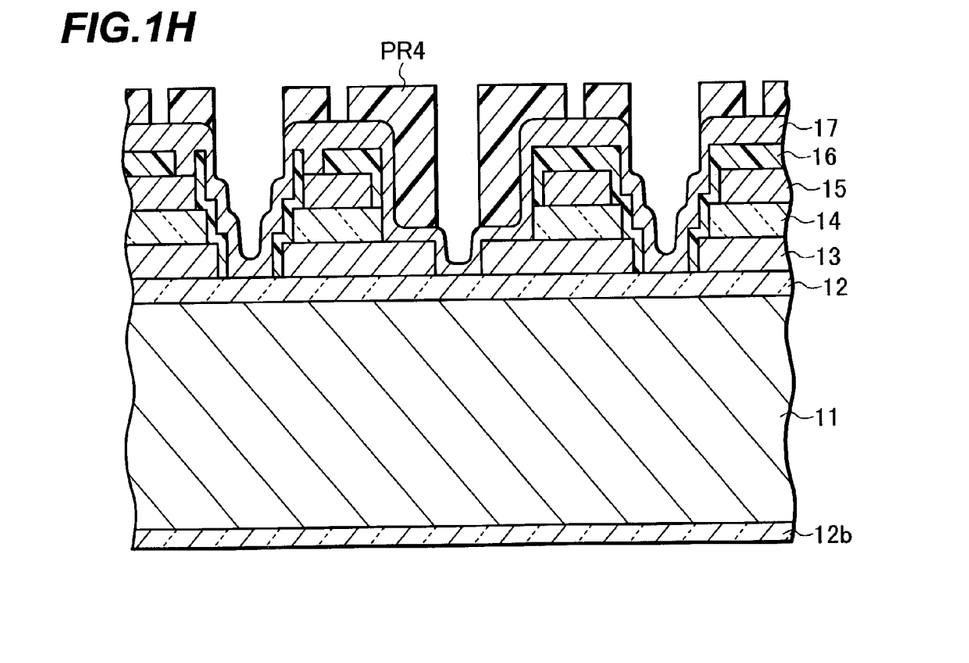

As shown in FIG. 1H, a photoresist pattern PR4 is formed on the copper wiring layer 17. The photoresist pattern PR4 has a wiring pattern to be connected to the upper electrode 15 and lower electrode 13 of the capacitor, other wiring patterns to be formed on the polyimide layer 16, and if necessary, inductor element patterns. By using the photoresist pattern PR4 as a mask, the copper wiring layer 17 is etched.

Figure 1I:
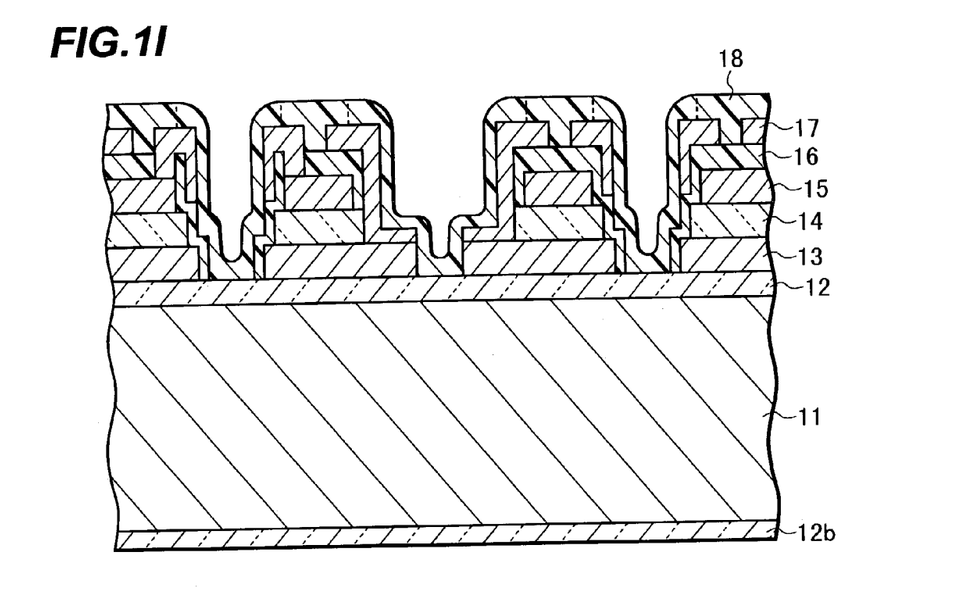

As shown in FIG. 1H, a photosensitive polyimide layer 18 is coated covering the copper wiring pattern 17. The photosensitive polyimide layer 18 is exposed and developed to partially and selectively remove it. The polyimide layer 18 is therefore formed which has openings exposing wiring contacts.

Figure 1J:
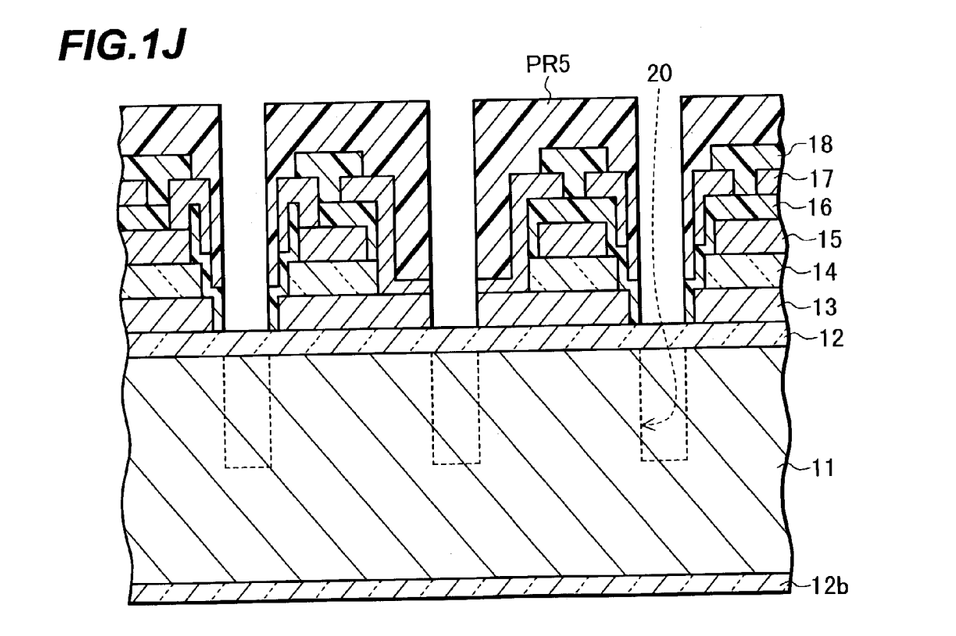

As shown in FIG. 1J, covering the polyimide layer 18, a photoresist layer is coated over the Si substrate 11. The photoresist layer is exposed and developed to form a resist pattern PR5 having openings in the areas where holes or trenches are formed. By using the photoresist pattern PR5 as a mask, the silicon oxide layer 12 is patterned by wet etching or dry etching. Thereafter, holes or trenches 20 having a depth of about 150 μm is formed in the Si substrate 11 by performing anisotropic dry etching (reactive ion etching) for about 60 minutes by using, e.g., an inductive coupled plasma etching system. The photoresist pattern PR5 is thereafter removed.

Figure 1K:
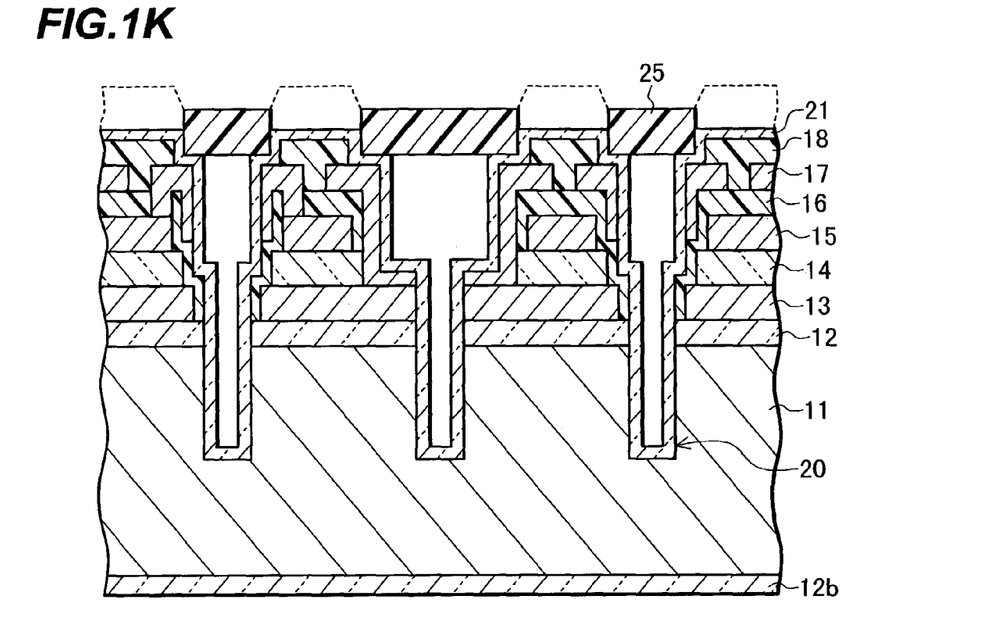

As shown in FIG. 1K, the substrate is placed in a CVD system and a silicon oxide film 21 is deposited by CVD, the silicon oxide film 21 having a thickness of about 2 μm on the flat surface. Although the silicon oxide film in the hole or trench having a high aspect ratio becomes thinner at a deeper position, the whole inner wall is covered with the silicon oxide film.

Figure 1L:
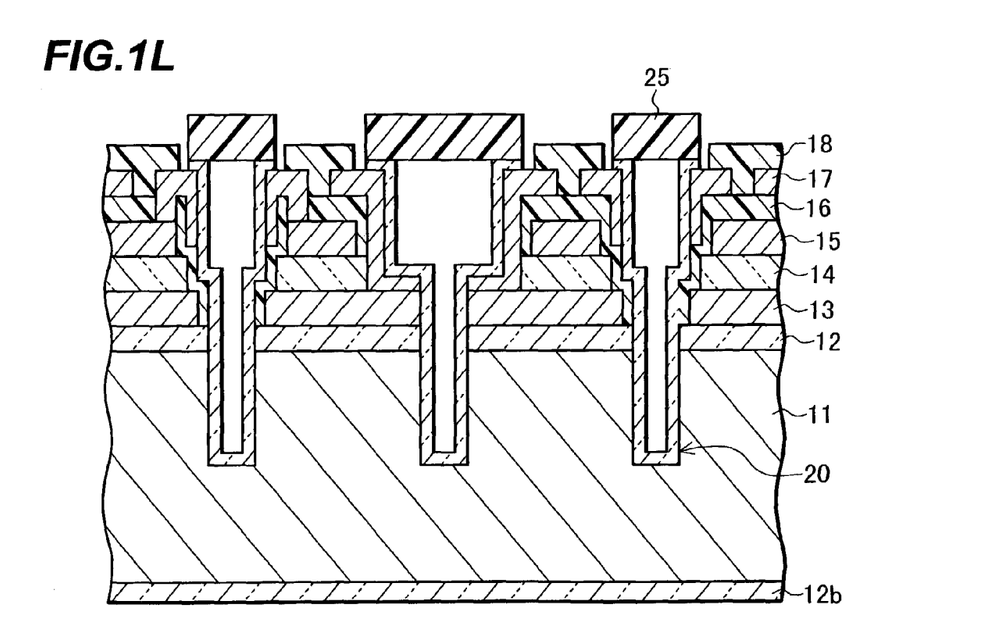
Figure 1M:
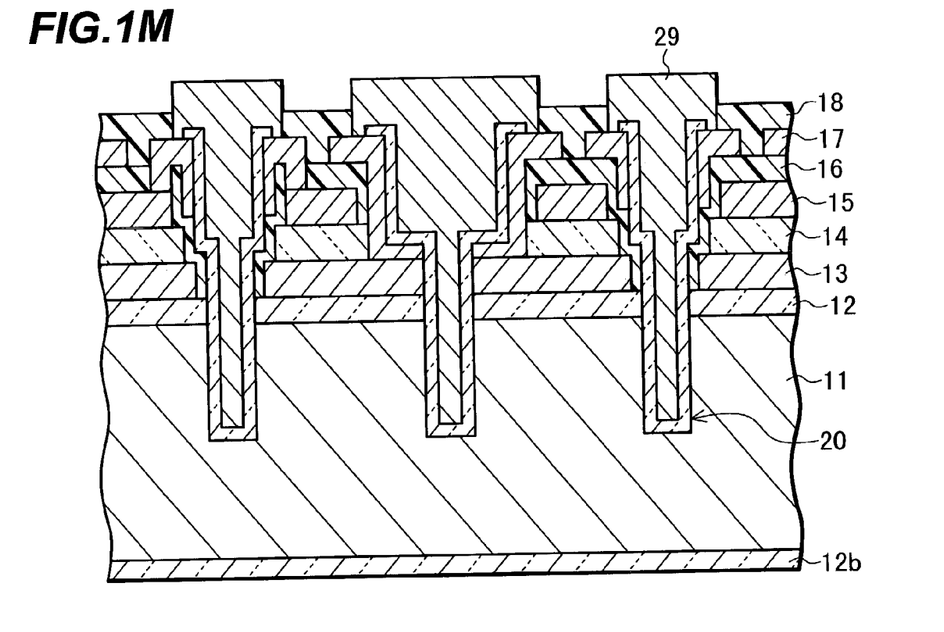
Figure 1N:
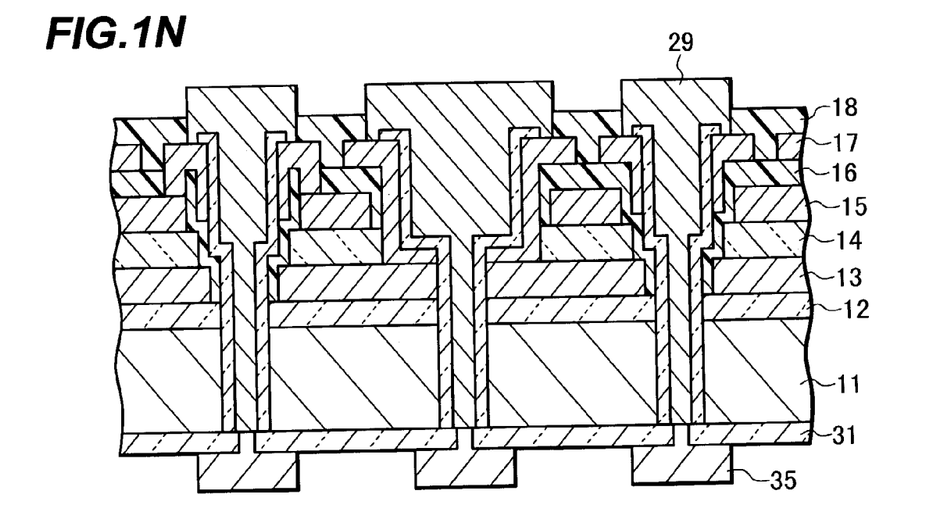
Figure 1O:
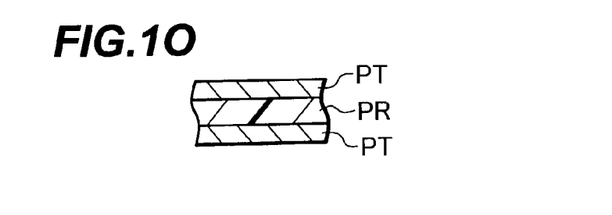

FIG. 1O shows a dry film of a three-layer structure. A photoresist layer PR is sandwiched between a pair of protective layers PT. One protective layer PT is peeled off. Then, the dry film is placed on the substrate surface with the exposed resist layer PR being directed downward. The dry film is pressed with a roller to adhere it to the substrate surface. The other protective layer is peeled off to expose the dry film.

As shown in FIG. 1K, the dry film is exposed and developed to leave a dry film pattern 25 which caps the holes or trenches. Because the hole or trench formed by etching is capped with the dry film pattern 25, it is possible to prevent foreign matters or patterning process residues from entering the hole or trench.

As shown in FIG. 1L, the silicon oxide film 21 exposed by the dry film pattern 25 is etched and removed with, e.g., dilute hydrofluoric acid. Thereafter, the dry film pattern is swelled and removed. The dry film pattern 25 can be removed without being dropped in the hole or trench.

As shown in FIG. 1M, a copper layer is formed over the surface of the substrate to bury the hole or trench with copper and cover the substrate surface. For example, the copper wiring layer is formed by depositing a Cr adhesion layer and a Cu seed layer by sputtering and plating a Cu layer thereon. CVD may be used instead of plating. An unnecessary portion of the copper layer is removed by etching with a photoresist pattern to thereby form a copper wiring pattern 29 having a vertical region.

In the structure shown in FIG. 1M, a left wiring 29 is cormected to the upper electrode of the capacitor and the middle wiring 29 is connected to the lower electrode of the capacitor. Both the wirings are formed through the electrodes of the capacitor so that the contact wiring length is very short. Because parasitic inductance can be reduced, a high speed operation of the capacitor can be enhanced. The right wiring 29 is disposed independently from the capacitor and constitutes a signal wiring line or the like.

As shown in FIG. 1N, the Si substrate 11 is polished from the bottom surface thereof to expose the wiring 29. The wiring 29 is a through wiring which passes through the Si substrate 11. On the exposed Si surface, an insulating film layer 31 such as silicon oxide is formed and an opening exposing the wiring 29 is formed by etching with a resist pattern. On the exposed wiring 29, a contact pad 35 is formed.

With the above-described processes, a circuit board can be manufactured which has through conductors and a capacitor having a small parasitic inductance and connected to the through conductors. Wirings can also be formed at the same time. The wirings may have a multilevel wiring structure. A hole or trench through which the through conductor passes is formed by etching the Si substrate to a partial depth thereof so that a process time can be shortened.

In the above-described embodiment, after the hole or trench is capped with a dry film, wet etching is performed at an atmospheric pressure. Alternatively, dry etching in a low pressure atmosphere may be performed.

Figure 2:
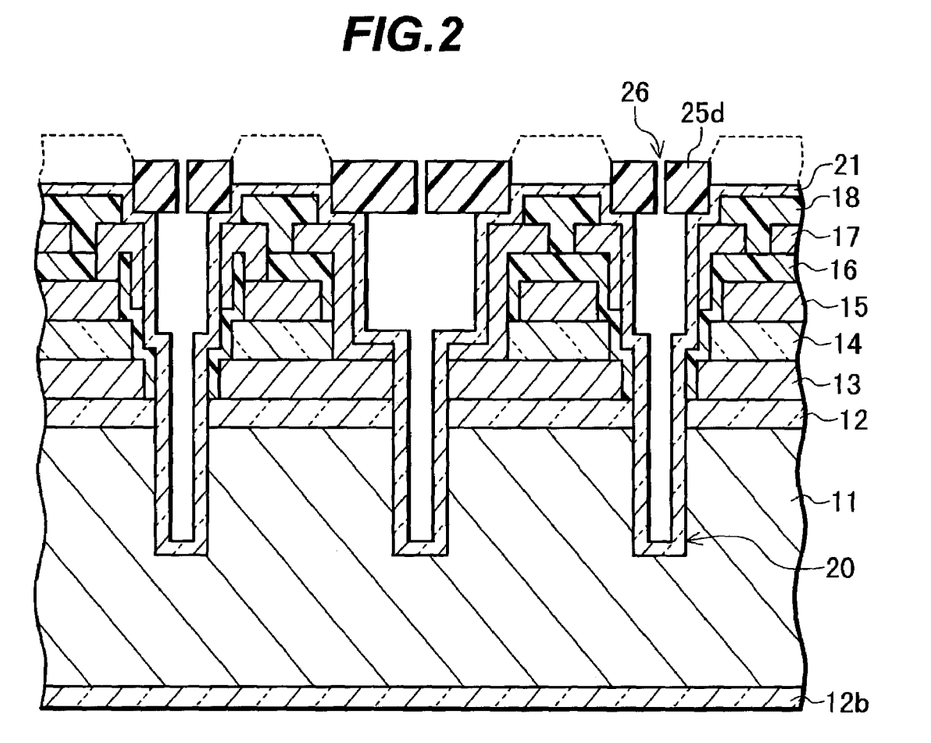
FIG. 2 is a schematic cross sectional view illustrating a method of manufacturing an electronic circuit component according to another embodiment of the invention.

FIG. 2 shows a pattern of a dry film 25d used when dry etching is performed. The dry film 25d has an air path hole 26 above the hole or trench 20. As a circuit board is placed in a vacuum chamber and the inner pressure is reduced, air in the hole or trench 20 is exhausted via the air path hole 26 to the external. An insulating layer on the surface of the circuit board is dry-etched by plasma etching or the like. Because the air path hole 26 can be formed finely, an insulating layer in the inner wall of the hole or trench is etched scarcely.

In the above-described embodiments, a hole or trench is formed in the Si substrate to an intermediate depth thereof, and the Si substrate is polished from the bottom surface to expose the conductor formed in the hole or trench. A hole or trench may be formed in the Si substrate to the whole thickness thereof. The processes of this embodiment will be described in the following.

Processes similar to the processes shown from FIG. 1A to FIG. 1I are preformed.

Figure 3A:
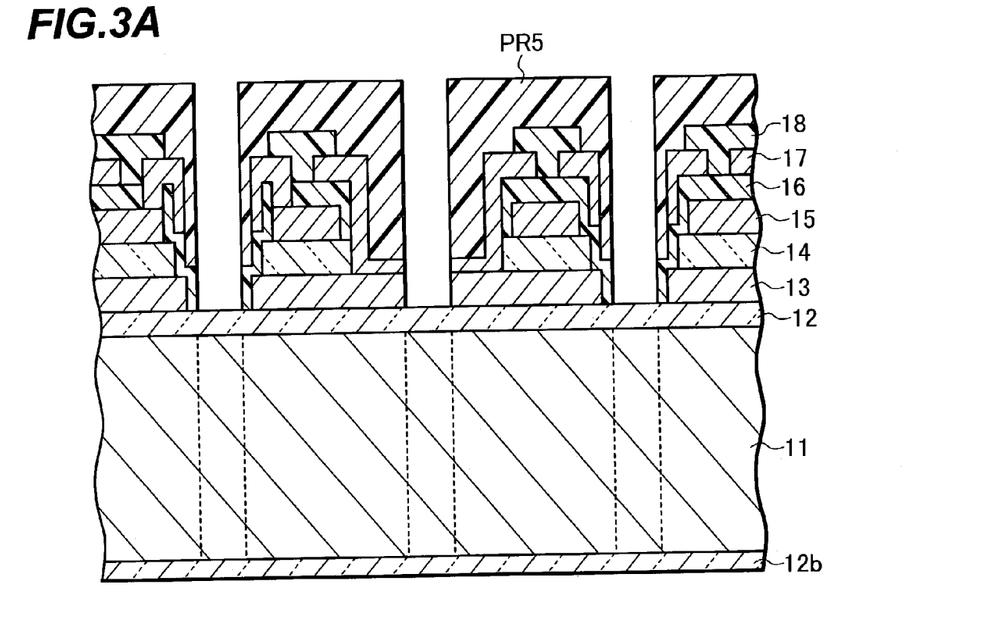
FIGS. 3A and 3B are schematic cross sectional views illustrating a method of manufacturing an electronic circuit component according to another embodiment of the invention.

As shown in FIG. 3A, in a process corresponding to the process shown in FIG. 1J, the Si substrate 11 is etched to the whole thickness thereof. In this case, the silicon oxide layer 12b formed on the bottom surface of the Si substrate can be used as an etching stopper. In place of the silicon oxide layer, a CVD silicon nitride layer may be formed beforehand as an etching stopper layer. A lamination of a silicon oxide layer and a silicon nitride layer or the like may be used as an etching stopper layer. Thereafter, processes corresponding to the processes shown in FIGS. 1K and 1L are performed.

Figure 3B:
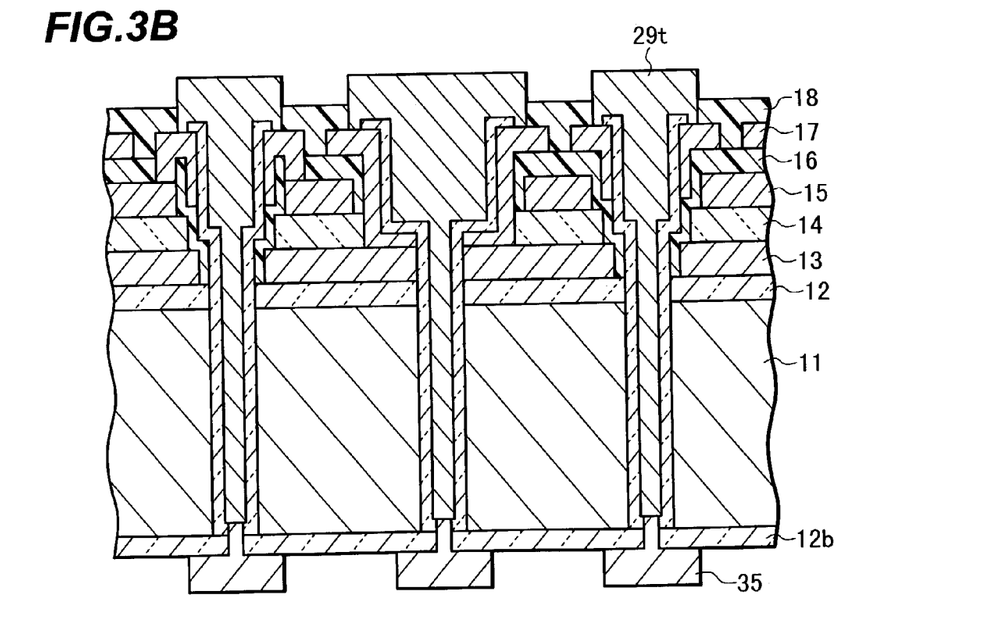

As shown in FIG. 3B, after a through conductor 29t is formed, an opening for exposing the through conductor 29t is formed through the etching stopper layer 12b on the bottom surface of Si substrate, and a pad is formed covering the exposed through conductor.

In the embodiment shown in FIGS. 3A and 3B, an etching time is prolonged because the whole thickness of the Si Substrate is etched. However, it is easy to form thin film circuit elements on the bottom surface of the Si substrate. An embodiment of forming additional circuit elements will be described in the following.

Figure 4A:
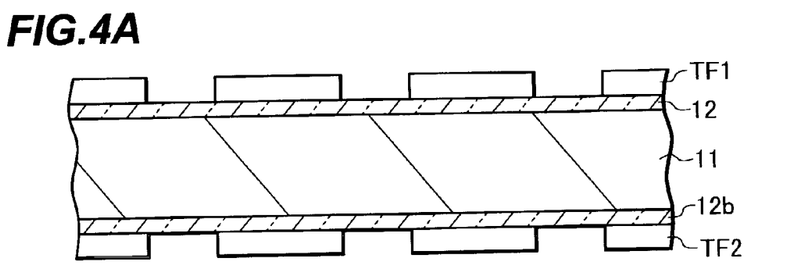
FIGS. 4A to 4D are schematic cross sectional views illustrating a method of manufacturing an electronic circuit component according to another embodiment of the invention.

As shown in FIG. 4A, on the top surface of an Si substrate 11 formed with silicon oxide layers 12 and 12b, thin film circuit elements TF1 are formed, and on the bottom surface thereof, thin film circuit elements TF2 are formed.

Figure 4B:
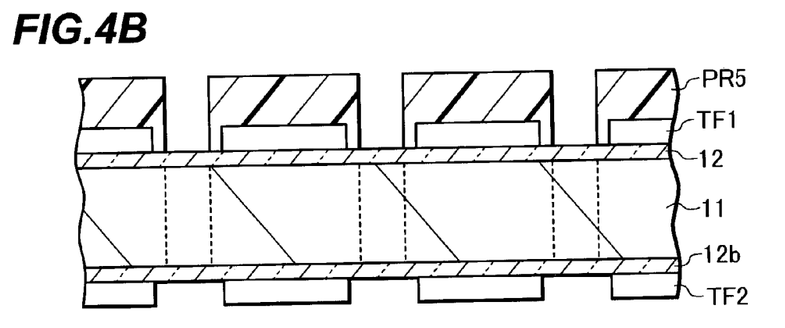

As shown in FIG. 4B, by using a photoresist pattern PR5 as a mask, holes or trenches are etched from the top surface of the Si substrate. In this etching, the insulating layer 12b on the bottom surface of the Si substrate functions as an etching stopper layer.

Figure 4C:
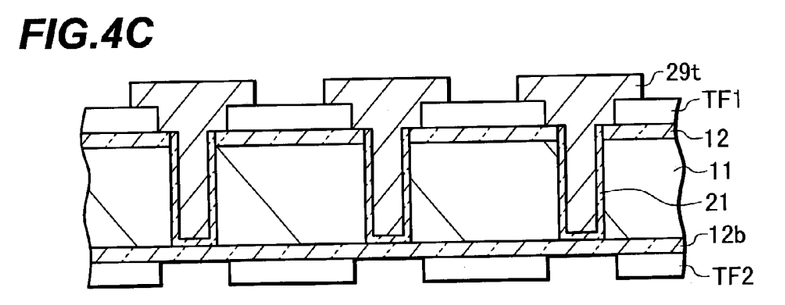

As shown in FIG. 4C, through conductors 29t are formed.

Figure 4D:
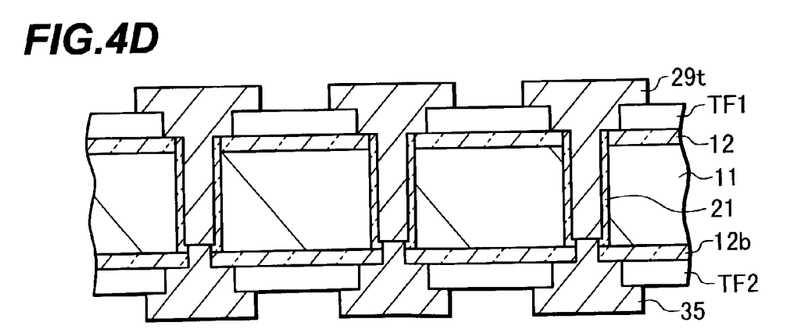

As shown in FIG. 4D, the etching stopper layer 12b is partially etched to expose the bottoms of the through conductors 29t and pads 35 are formed. With these processes, a circuit board can be formed which has thin film circuit elements on the top and bottom surfaces of the Si substrate.

Methods of forming a circuit board has been described by using an Si substrate. A substrate other than an Si substrate may be used.

Figure 5A:
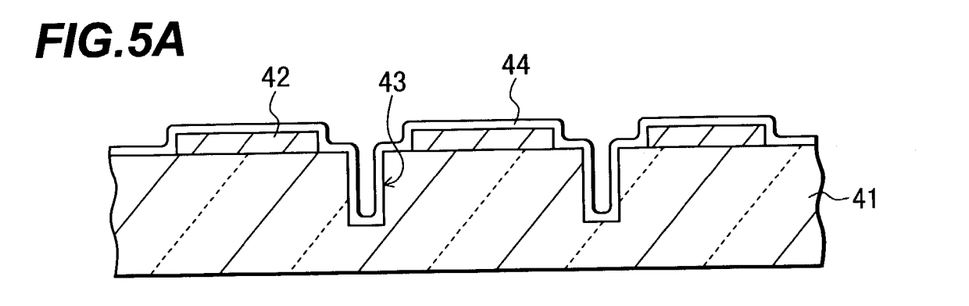
FIGS. 5A to 5C are schematic cross sectional views illustrating a method of manufacturing an electronic circuit component according to another embodiment of the invention.
Figure 5B:
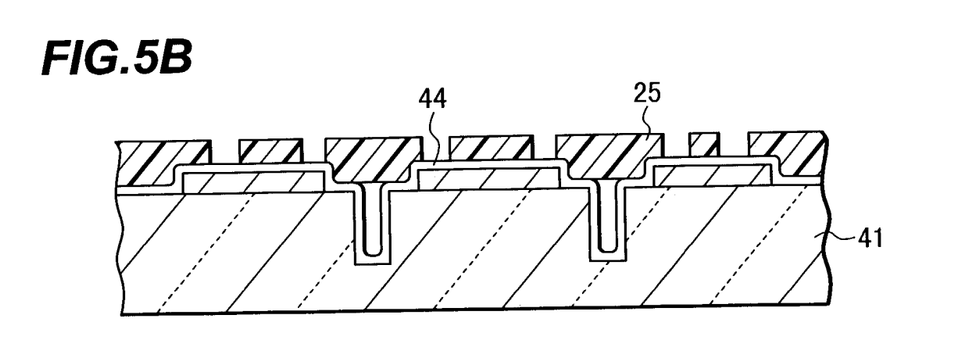
Figure 5C:
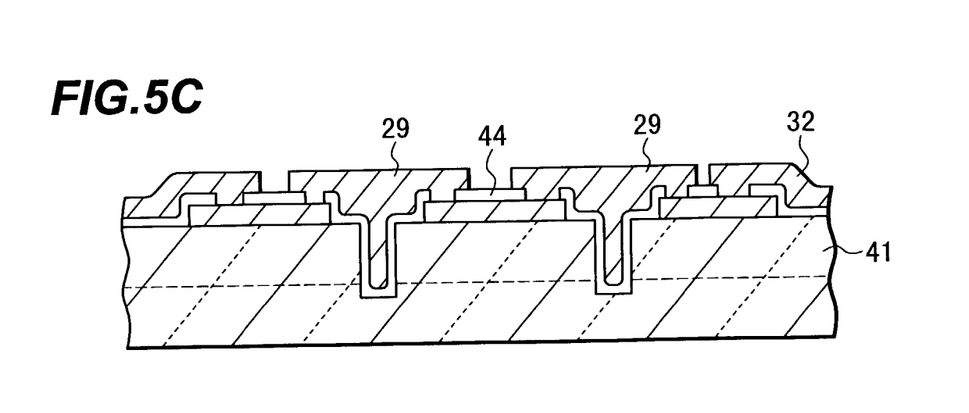

FIGS. 5A to 5C illustrate a method of forming a circuit board by using a glass substrate as an insulating substrate.

As shown in FIG. 5A, thin film circuit elements 42 are formed on the surface of a glass substrate 41. After a hole 43 is formed in the glass substrate 41 to a partial depth thereof, an insulating layer 44 of silicon oxide or the like is deposited over the whole surface of the glass substrate.

As shown in FIG. 5B, a dry film is adhered to the glass substrate, exposed and developed to form a dry film pattern 25. The holes 43 are capped with the dry film pattern 25. The dry film pattern 25 is formed on the surface of the insulating layer 44 to be left unetched. In this state, etching is performed to selectively remove the insulating layer 44.

As shown in FIG. 5C, the dry film 25 is swelled and removed. Thereafter through conductors 29 and other wirings 32 are formed.

Thereafter, the glass substrate 41 is polished from the bottom surface thereof to expose the bottoms of the through conductors 29. Contact pads and the like are formed on the exposed bottoms of the through conductors 29 to complete a circuit board. As described above, a circuit board can be formed by using substrates made of a variety of materials.

Figure 6A:
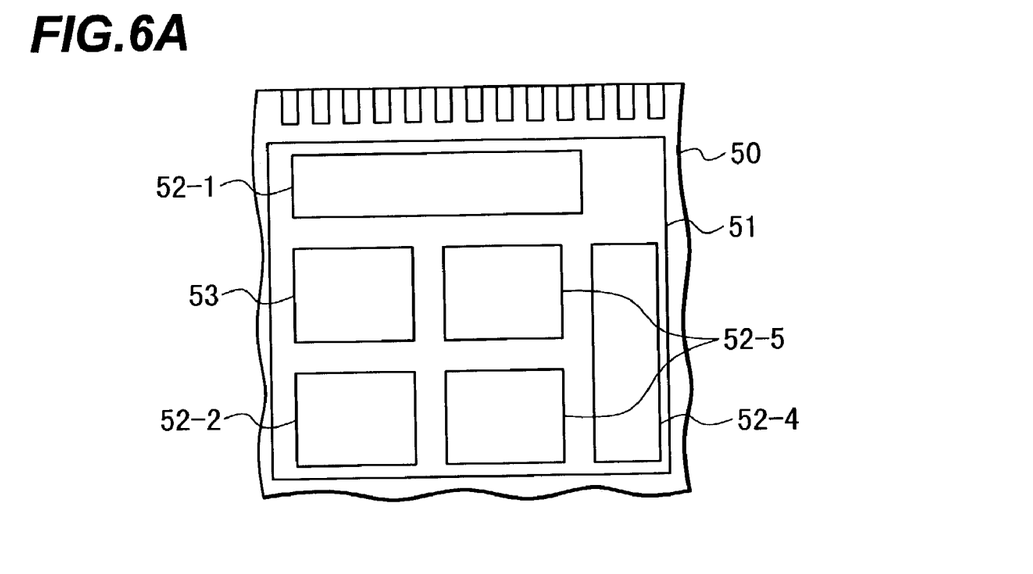
FIGS. 6A and 6B are a plan view and a cross sectional view showing the structure of a system-in-package.

FIG. 6A is a plan view of a system-in-package structure wherein an interposer substrate 51 is stacked on a circuit board 50 and semiconductor integrated circuit devices are disposed on the interposer substrate 51. The interposer substrate 51 is mounted on the circuit board 50 and circuit components 52-1 to 52-5 including a plurality of semiconductor elements are mounted on the interposer substrate 51. Semiconductor elements may be an arithmetic and logical unit, a digital signal processor (DSP), a memory, a high frequency (RF) IC, an input/output (I/O) interface and the like. Another circuit component 53 is a SAW filter or the like.

A wiring pattern is formed on the circuit board 50, and the interposer substrate 51 containing capacitors and wiring patterns is interposed between the circuit board 50 and the semiconductor elements 52-1 to 52-5 and circuit component 53.

Figure 6B:
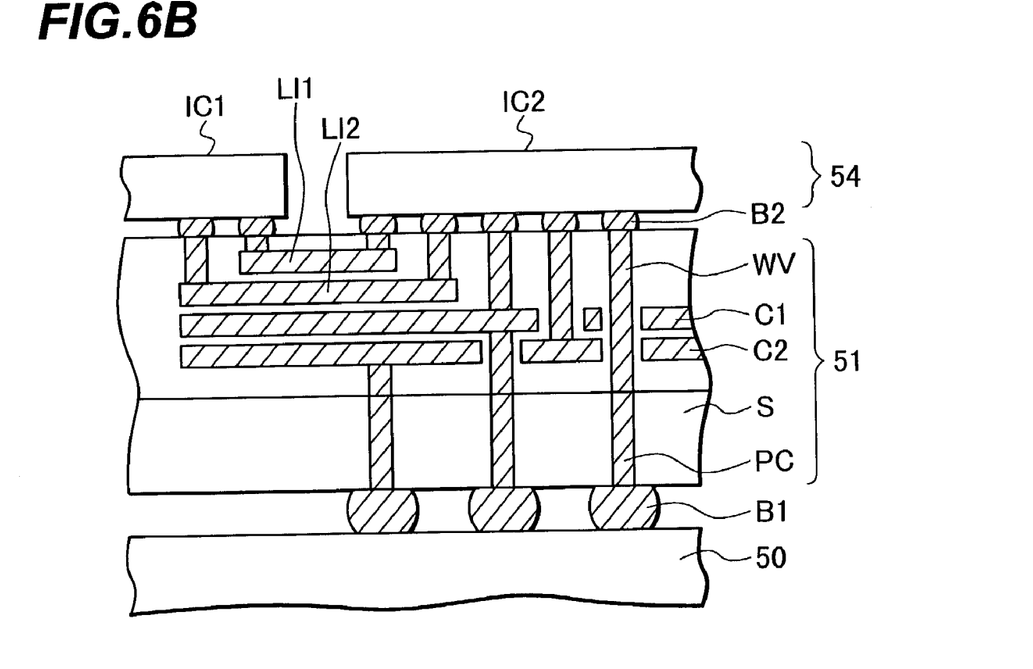

FIG. 6B is a schematic diagram showing a portion of wirings in the interposer substrate 51. The interposer substrate 51 is disposed on the circuit board 50, and circuit components 54 including a plurality of semiconductor elements IC1 and IC2 are disposed on the interposer substrate 51. Formed in the interposer substrate 51 are through conductors PC supported by a support substrate S, vertical wirings WV connected to the through conductors PC, capacitor electrodes C1 and C2 connected to the vertical wirings WV, and local interconnects LI1 and LI2 connected to terminals of the semiconductor elements.

A pitch of terminals of the semiconductor elements IC1 and IC2 is narrower than a pitch of terminals of the circuit board 50. If the terminals of the semiconductor elements IC1 and IC2 are to be interconnected by wirings on the circuit board 50, it is necessary to widen the wiring pitch. By utilizing the wirings in the interposer substrate 51, the semiconductor elements IC1 and IC2 can be interconnected at a shorter wiring length without changing the wiring pitch or by suppressing the enlargement of the wiring pitch.

Figure 7A:
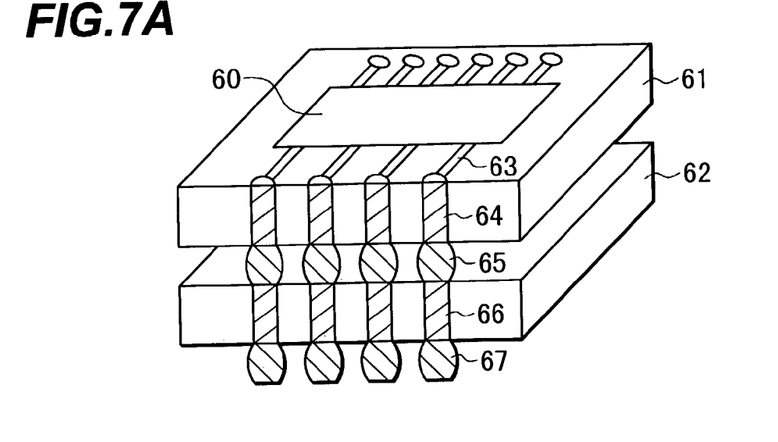
FIGS. 7A to 7C are perspective views and a side view showing the structure of a multilevel circuit board.
Figure 7B:
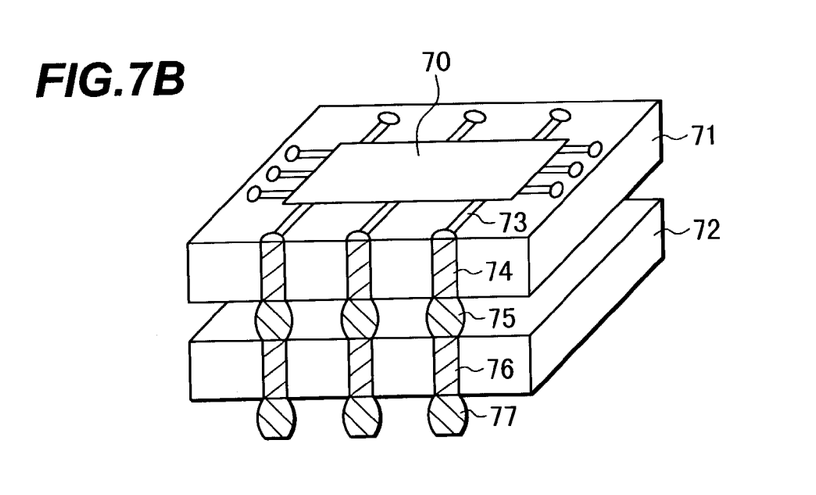
Figure 7C:
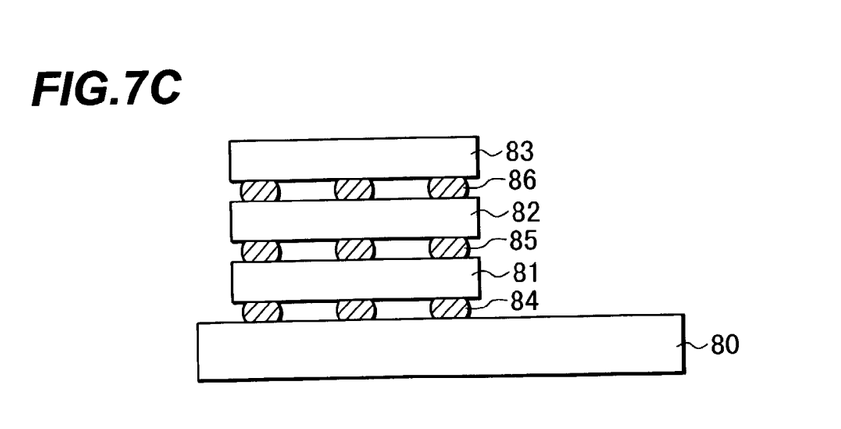

FIGS. 7A and 7B are perspective views showing a lamination structure of a plurality of semiconductor element layers of the same type, and FIG. 7C is a side view showing a lamination structure of a plurality of semiconductor element layers of different types.

FIG. 7A shows a lamination structure of a plurality of low integration semiconductor element layers. An IC multilevel circuit board can be formed by stacking a plurality of IC layers, or a memory multilevel circuit board can be formed by stacking a plurality of memory layers. With such a multilevel structure, the performance of the circuit board can be improved. In the example shown in FIG. 7A, a semiconductor circuit 60 such as an IC and a memory disposed on a chip 61 having through conductors 64 is connected to an underlying chip 62 via lead wires 63, through conductors 64 and bumps 65. The chip 62 is connected to an underlying layer (not shown) via through conductors 66 and bumps 67.

FIG. 7B shows a lamination structure of a plurality of high integration semiconductor element layers, in comparison with the lamination structure of a plurality of low integration semiconductor element layers shown in FIG. 7A. In this example shown in FIG. 7B, an LSI circuit 70 disposed on a chip 71 having through conductors 74 is connected to an underlying chip 72 via lead wires 73, through conductors 74 and bumps 75. The chip 72 is connected to an underlying layer (not shown) via through conductors 76 and bumps 77.

FIG. 7C shows a composite multilevel circuit board using semiconductor elements of different types, in comparison with the lamination structure of a plurality of semiconductor element layers of the same type shown in FIGS. 7A and 7B. In the example shown in FIG. 7C, semiconductor element layers 81, 82 and 83 made of ICs, memories, LSIs and the like are disposed on a mother board 80 and interconnected via bumps 84, 85 and 86.

The present invention has been described in connection with the preferred embodiments. The invention is not limited only to the above embodiments. It will be apparent to those skilled in the art that various modifications, improvements, combinations, and the like can be made.

What we claim are:

1. A method of manufacturing an electronic circuit component, comprising the steps of:
   (a) forming a first thin film circuit element on a surface of a circuit board using an Si substrate;
   (b) forming a hole or trench going through a portion of a thickness of said Si substrate by etching from the surface of said circuit board;
   (c) forming an insulating film covering a surface of said formed hole or trench;
   (d) adhering a dry film of photoresist to the insulating film, said dry film capping an opening of said hole or trench;
   (e) patterning said dry film;
   (f) etching said insulating film by using said patterned dry film as a mask;
   (g) swelling said dry film to remove said dry film
   (h) forming a conductor pattern in said hole or trench;
   (i) removing a portion of the thickness of said Si substrate from a bottom surface side to expose said conductor pattern in said hole or trench; and
   (j) forming an insulating film on an Si surface exposed on the bottom surface of said circuit board.

2. The method of manufacturing an electronic circuit component according to claim 1, wherein said conductor pattern is connected to said first thin film circuit element.

3. The method of manufacturing an electronic circuit component according to claim 1, further comprising the steps of:
   (k) forming an etching stopper layer on a bottom surface of said Si substrate before said step (b), said step (b) etching said Si substrate until said etch stopper layer is exposed; and
   (l) selectively etching said etch stopper layer to expose said conductor pattern in said hole or trench.

4. The method of manufacturing an electronic circuit component according to claim 3, further comprising the step of:
   (k) forming a second thin film circuit element on a bottom surface of said circuit board before said step (b).

5. The method of manufacturing an electronic circuit component according to claim 4, further comprising the step of:
   (l) forming a contact pad on the bottom surface of said circuit board, said contact pad being connected to said exposed conductor pattern.

6. The method of manufacturing an electronic circuit component according to claim 5, wherein said step (e) forms an air path hole through said dry film above said hole or trench, and said step (f) is performed in a low pressure atmosphere.

7. The method of manufacturing an electronic circuit component according to claim 4, wherein said first thin film circuit element includes a capacitor made of a lower electrode, a dielectric film and an upper electrode, a first lead connected to the lower electrode, extending upward, and passing through the upper electrode, and a second lead connected to the upper electrode and extending upward.

8. The method of manufacturing an electronic circuit component according to claim 1, further comprising the step of:
   (k) forming a contact pad on the bottom surface of said circuit board, said contact pad being connected to said exposed conductor pattern.

9. The method of manufacturing an electronic circuit component according to claim 8, wherein said step (e) forms an air path hole through said dry film above said hole or trench, and said step (f) is performed in a low pressure atmosphere.

10. The method of manufacturing an electronic circuit component according to claim 1, wherein said first thin film circuit element includes a capacitor made of a lower electrode, a dielectric film and an upper electrode, a first lead connected to the lower electrode, extending upward, and passing through the upper electrode, and a second lead connected to the upper electrode and extending upward.

* * * * *